United States Patent [19]

Kubo et al.

[11] Patent Number: 4,733,260

[45] Date of Patent: Mar. 22, 1988

[54] CONTINUOUS PLATE MAKING METHOD FOR PHOTOSENSITIVE RESIN PLATE AND DEVICE THEREOF

[75] Inventors: Haruo Kubo; Kosaku Onodera, both of Ohtsu, Japan

[73] Assignee: Toyo Boseki Kabushiki Kaisha, Japan

[21] Appl. No.: 707,268

[22] Filed: Mar. 1, 1985

[30] Foreign Application Priority Data

Mar. 5, 1984 [JP] Japan .................. 59-42651
Mar. 6, 1984 [JP] Japan .................. 59-43614

[51] Int. Cl.⁴ ............................ G03D 15/04
[52] U.S. Cl. .................. 354/317; 354/325; 15/77; 15/102; 134/64 P
[58] Field of Search .......... 354/317, 325; 15/77, 15/102; 430/300; 118/111, 643; 134/148, 64 P, 70, 72, 78, 131

[56] References Cited

U.S. PATENT DOCUMENTS

| | | | |
|---|---|---|---|
| 2,555,874 | 6/1951 | Coughlin | 354/317 |
| 3,088,391 | 5/1963 | Sigler | 134/148 |
| 3,559,558 | 2/1971 | Hamlin | 354/317 |
| 3,589,261 | 6/1971 | Krikelis | 354/325 |
| 3,727,536 | 4/1973 | Bunker | 354/325 |
| 3,812,514 | 5/1974 | Watabe | 354/325 |
| 3,981,583 | 9/1976 | Tsuchida et al. | 354/325 |
| 4,215,928 | 8/1980 | Bayey et al. | 354/325 |
| 4,428,659 | 1/1984 | Howard | 354/317 |

FOREIGN PATENT DOCUMENTS

| | | | |
|---|---|---|---|
| 2734688 | 2/1979 | Fed. Rep. of Germany | 354/325 |
| 55-21399 | 2/1980 | Japan . | |

*Primary Examiner*—A. A. Mathews
*Attorney, Agent, or Firm*—Jones, Tullar & Cooper

[57] ABSTRACT

A continuous plate making method for a photosensitive resin plate which comprises setting the photosensitive resin plate on a surface of an endless belt or a setting plate which moves on a substantially circular orbit, and continuously subjecting the plate to, at least, washing out, drying and then post light exposure steps as the belt or the setting plate moves continuously. A device for carrying out this method is also disclosed.

7 Claims, 2 Drawing Figures

CONTINUOUS PLATE MAKING METHOD FOR PHOTOSENSITIVE RESIN PLATE AND DEVICE THEREOF

FIELD OF THE INVENTION

The present invention relates to a continuous plate making method for photosensitive resin plates and a device thereof. More particularly, according to the present invention, photosensitive resin plates can be continuously and automatically made into engraved plates such as printing plates and the like without requiring a large space.

BACKGROUND OF THE INVENTION

Usually, a photosensitive resin plate is composed of a support material such as a plastic film, a metallic plate or the like, and a photosensitive resin layer formed on the surface of the support material. In order to make a photosensitive resin plate into an engraved plate such as a printing plate or the like, an original film is contacted on the surface of the photosensitive resin layer of the plate and an actinic light is irradiated to insolubilize the exposed part of the plate. Then, the non-exposed part is washed out with a solvent and thereafter, the plate is subjected to work up steps such as hydro-extracting, drying, post light exposure, etc. to form a printing plate or the like.

At present, a method mainly employed in the above plate making is a batch-wise method wherein each of the steps of washing out, hydro-extracting, drying and post light exposure are carried out separately by using different devices and, during the plate making, the plate is manually moved one step to another. For example, a photosensitive resin plate which has been exposed to light is set in a wash-out device where the non-exposed part thereof is is washed out. Thereafter it is moved to a drier by hand to dry the plate.

In order to constantly and quickly make photosensitive resin plates into engraved plates such as printing plates of stable high quality, a continuous and automatic plate making method has been required. In this regard, the development of a continuous plate making method has recently been started, wherein the above steps are continuously carried out while a photosensitive resin plate set on a surface of a belt or a so-called setting plate is moved horizontally. For carrying out this method, there has been developed a combination of devices wherein devices for each step such as washing out, hydro-extracting, drying, post light exposure and the like are arrayed in order of the steps on the same level parallel with the floor. The photosensitive resin plate is set on a chain or a setting plate fixed to a chain and the chain is driven intermittently or continuously.

However, in this combination of devices, there are drawbacks such as the requirement for a large space for arraying the devices, and poor working efficiency due to the long distance between openings for feeding and removing the photosensitive resin plate.

In order to save labor as much as possible and to reduce the space requirement, another continuous plate making method and a device thereof have been proposed (Japanese Patent Publication No. 21339/1980). In this method, a photosensitive resin plate is set on a peripheral surface of a cylindrical drum rotating intermittently and all the steps for plate making are completed during one rotation cycle of the drum.

However, in the above method and device, the rotation and stopping of the drum are repeated alternately at every angle of 120° because of intermittent rotation and each step is carried out at the same time while the drum is stopped. Therefore, each step should be completed within the same period of time. Further, because each step is carried out while the photosensitive resin plate and the means for the treatment of each step is in one fixed position, it is difficult to effect the treatment of each step uniformly. In addition, the photosensitive resin plate is removably set on the drum by means of electromagnets and only up to 3 sheets of photosensitive resin plates can be treated per one rotation cycle.

OBJECTS AND SUMMARY OF THE INVENTION

One object of the present invention is to provide an improved continuous plate making method for a photosensitive resin plate which does not have drawbacks such as those of the conventional plate making methods described above.

Another object of the present invention is to provide a device for carrying out the continuous plate making method of the present invention.

These objects as well as other objects and advantages of the present invention will become apparent to those skilled in the art from the following description and the accompanying drawings.

According to the present invention, there is provided a continuous plate making method for a photosensitive resin plate which comprises setting the photosensitive resin plate on a surface of an endless belt or a setting plate which moves in a substantially circular orbit, preferably, on an inside or outside surface thereof so that the inside surface there of radially forces the inside of the orbit, and continuously subjecting the resin plate to, at least, washing out, drying and post light exposure steps as the belt or the setting plate moves continuously. The device of the present invention comprises a carrier means arranged in a substantially circular shape, at least one endless belt or a setting plate which receives a photosensitive resin plate and moves along the carrier means on an orbit defined by the carrier means, preferably, the inside surface of the belt or the setting plate radially facing the to inside of the orbit, and a means for subjecting the plate to, at least, washing out, drying and post light exposure steps arranged around the orbit of the belt or the setter plate so that the treatment of each step is carried out in order as the belt or the setter plate moves continuously.

PREFERRED EMBODIMENT OF THE INVENTION

In one preferred embodiment, the continuous plate making method of the present invention is carried out by setting a photosensitive resin plate which has been contacted with an original film and exposed to an actinic light on the inside surface of the belt or the setting plate moving on a vertical circular orbit so that the inside surface thereof radially faces the inside of the orbit. The device illustrated in FIG. 1 is used for carrying out this embodiment.

Figure 1:
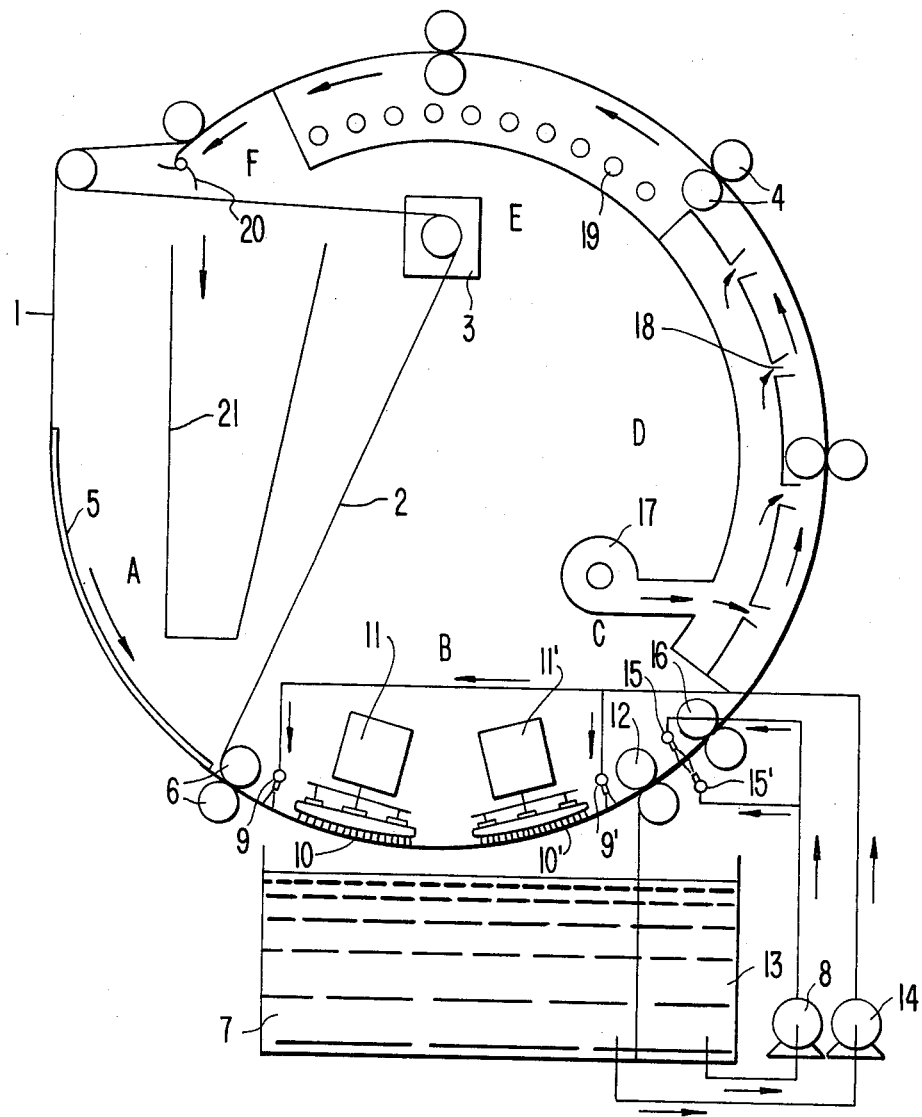
FIG. 1 illustrates a schematic cross section of a preferred embodiment of the continuous plate making device of the present invention.

In FIG. 1, the device includes an endless belt 1 which is vertically arranged and is driven at a constant speed by means of a chain 2 and a motor 3. The belt 1 continuously moves in a substantially circular orbit along carrier means 4 in a counterclockwise direction as shown by the arrows shown in FIG. 1. The carrier means shown in FIG. 1 comprises the pairs of rollers. However, for example, it may be pairs of guides or, when using one or more setting plates instead of the endless belt, it may be tenter or the like to which each side of the setting plate is fixed. The surface of the endless belt 1 or the setting plate on which the photosensitive resin plate set is radially faces the inside of the orbit and is preferably made of a plastic layer having stickiness or a magnetic rubber.

The photosensitive resin plate 5 which has been already exposed to an actinic light is set on the inside surface of the belt 1 moving on a vertical circular orbit defined by the carrier means 4 at the position shown by the letter A. As the belt moves, the pair of rollers 6 removably joins the plate 5 to the belt 1.

In the device of FIG. 1, the means for subjecting the plate to washing out, drying and post light exposure is divided into four sections shown by the letters B through E.

In section B, the non-exposed part of the plate 5 is washed out. A developing solution (i.e., a solvent for dissolving or dispersing the non-exposed part of the photosensitive resin layer of the plate such as water, an aqueous alkaline solution, alcohol, etc.) which is delivered from a tank 7 by means of a pump 8 is poured onto brushes 10 and 10' from nozzles 9 and 9'. The brushes 10 and 10' are driven by motors 11 and 11' and the non-exposed part of the photosensitive resin plate 5 is continuously washed out by eccentric or rotary motion of the brushes. Then, the pair of pinch rolls 12, which have porous surfaces, squeezes out the solution remaining on the plate 5. The solution returns to the tank 7. By the way, in the washing out step of the sectioon B, spraying can be employed instead of brushing, by spraying the developing solution from plural spray nozzles to wash out the non-exposed part. Further, in the case of a thin plate, it is possible to actuate only one of the brushes 10 or 10'.

In section C, rinsing is carried out. A fresh rinsing solution (e.g., fresh water, alcohol, etc.) which is delivered from a tank 13 by means of a pump 14 is sprayed onto the plate and the belt from the nozzles 15 and 15' to completely rinse out the developing solution, the non-exposed part of the photosensitive resin layer and the like remaining on the surfaces of the plate and the belt. Thereafter, the pair of pinch rolls 16 squeezes out the fresh rinsing solution remaining on the plate. The rinsing solution is returned to the tank 13.

Drying is carried out in section D. As the plate and the belt move, hot air is blown out from a blower 17 through plural openings 18 to continuously dry the plate 5.

In section E, post light exposure is carried out. Actinic light sources (for example chemical lamps, high pressure mercury lamps etc.) 19 are provided along the inside of the belt 1 and the entire surface of the plate 5 on the bet 1 is exposed to the actinic light to further solidify the surface of the plate.

After continuously moving on the substantially circular orbit to complete all the steps, the photosensitive resin plate 5 is automatically removed from the belt 1 at the position shown by the letter F by means of the bend of a belt 1 and the scraper 20. The scraper 20 guides the plate to a receiving box 21. It is desirable to bend the belt 1 toward the outside of its circular orbit at the position F to such a degree that the angle between the belt and the tangent line of the circular orbit at the position F is 5° or more, preferably, 10° or more, so that the plate 5 is automatically and readily removed from the belt.

In another preferred embodiment, the continuous plate making method of the present invention is carried out by setting a photosensitive resin plate which has been contacted with an original film and exposed to an actinic light on the outside surface of the belt or the setting plate moving in a vertical circular orbit so that the inside surface thereof is radially facing the inside of the orbit. The device illustrated in FIG. 2 is used for carrying out this embodiment.

Figure 2:
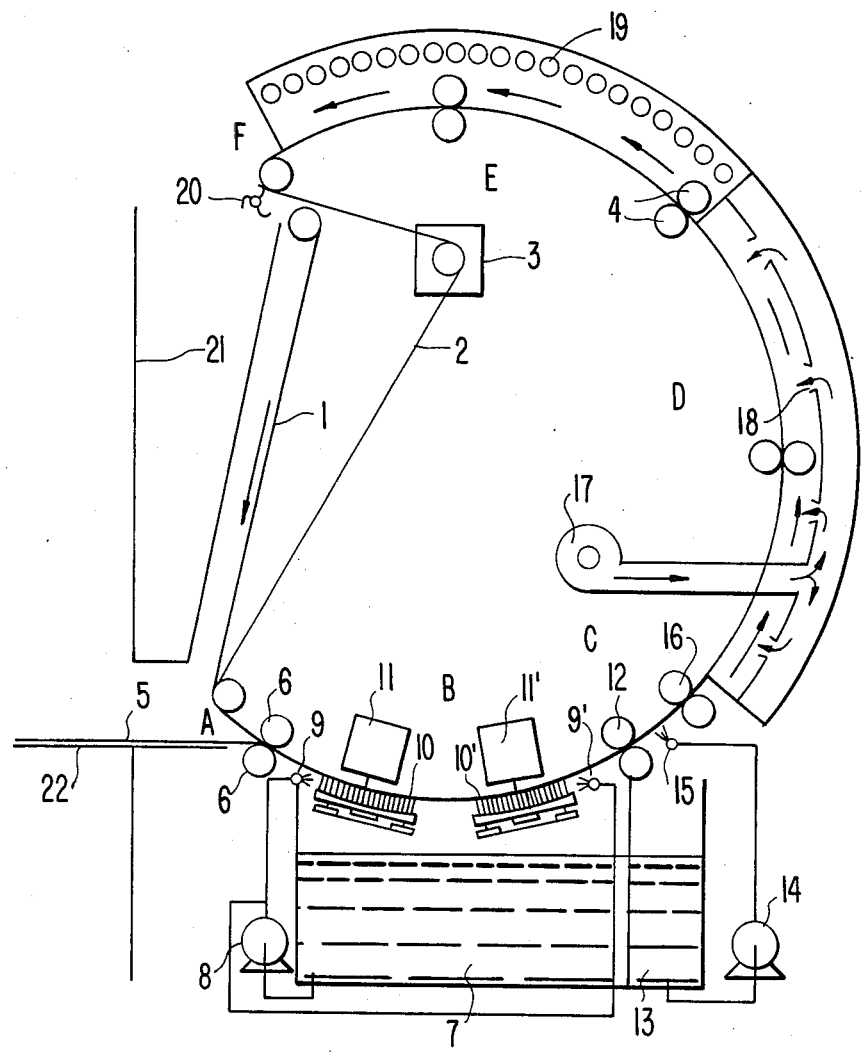
FIG. 2 illustrates a schematic cross section of another preferred embodiment of the continuous plate making device of the present invention.

As in the device of FIG. 1, the device of FIG. 2 has an endless belt 1 which is vertically arranged and is driven at a constant speed by means of a chain 2 and a motor 3. The belt 1 continuously moves in a substantially circular orbit along carrier means 4 in a counter-clockwise direction.

The photosensitive resin plate 5 which has been already exposed to an actinic light is placed on the stand 22 and fed to the outside surface of the belt 1 moving in a vertical circular orbit defined by the carrier means 4 at the position shown by the letter A. The pair of rollers 6 removably joins the plate 5 to the belt 1.

Likewise, the means for subjecting the plate to washing out, drying and post light exposure is divided into four sections shown by the letters B through E and each steps of washing out, rinsing, drying and post light exposure are carried out in the respective sections. However, in the device of FIG. 2, the treatment in each step is effected on the outside surface of the belt 1 and therefore, the means for these treatments are arranged so that the treatments can be effected in such a manner.

For example, in section B, the brushes 10 and 10' are provided at the outside of belt 1. In the section E, post light exposure is carried out by actinic light sources 19 provided along the outside of the belt 1.

In the device of FIG. 2, after completion of the treatments, the photosensitive resin plate 5 is also automatically removed from the belt 1 at the positioon shown by the letter F by means of a bend of the belt 1 and the scraper 20. The scraper 20 guides a plate to the receiving box 21. However, in this case, the belt is bent toward the inside of its circular orbit. It is desirable to bend the belt 1 toward the inside at the position F to such a degree that the angle between the belt and the tangent line of the circular orbit at the position F is 5° or more, preferably, 10° or more.

The continuous plate making method and the device of the present invention as described above can be applied to various photosensitive resin plates regardless of their kinds, sizes and thicknesses.

Further, in the method and the device of the present invention, only an operator who feeds photosensitive resin plates to the device is needed. The other steps such as washing out, drying and post light exposure as well as removal of the plates from the device continuously and automatically proceed in the device of the present invention. Accordingly, photosensitive printing plates having stable high qualities can be efficiently obtained.

Furthermore, there are such advantages that the space required for installing the device of the present invention is about ⅓ in comparison with that of a conventional device which is arranged horizontally because the device of the present invention is arranged circular, and that the operation is very easy because the feeding position is close to the removal position.

The following examples further illustrate the present invention in detail but are not to be construed to limit the scope thereof.

EXAMPLE 1

An original film was contacted on a surface of a photosensitive resin plate (Printight KF-95, a polyamide resin photoengraving material to be developed with water, manufactured by Toyo Boseki Kabushiki Kaish; size: A2 (420 mm×594 mm); thickness: 1.20 mm) and the plate was exposed to a 4 KW high pressure mercury lamp for 40 seconds to reproduce an image. According to this procedure, several photosensitive resin plates were exposed to the lamp to reproduce images.

The exposed plates were fed to the device shown in FIG. 1 or 2 at 3.5 minute intervals. Although, it took about 15 minutes until the first treated plate was received in the receiving box, the subsequent plates were surely obtained at regular time intervals of 3.5 minutes.

Each of the resultant printing plates had an image which was a precise reproduction of that of the original film and had good relief having a deep depth of relief.

EXAMPLE 2

According to the same procedure as in Example 1, several sheets of Printight KF-95 (size: A0 (841 mm×1,189 mm)) were exposed to the high pressure mercury lamp and fed to the device of FIG. 1 or 2 at 7 minute intervals. Although it took about 15 minutes until the first treated plate was received in the receiving box, the subsequent plates which were printing plates having high quality were obtained at regular time intervals of 7 minutes.

EXAMPLE 3

Conditions for each step for washing out, drying and post light exposure are different from each other depending upon the thickness of a photosensitive resin plate to be treated. Accordingly, the same procedure as in Example 1 was repeated by using the device of FIG. 1 or 2 and varying the conditions for each step as shown in Table 1. As a result, printing plates having high qualities as described in Example 1 were continuously obtained.

TABLE 1

| Thickness of plates (mm) | 1.52 | 1.20 | 0.95 | 0.70 | 0.43 |
|---|---|---|---|---|---|
| Time for washing out (sec.) | 220 | 165 | 120 | 100 | 40 |
| Time for drying (60° C. hot air, min) | 7 | 6 | 5 | 5 | 5 |
| Time for post light exposure (min.) | 7 | 6 | 5 | 5 | 5 |

EXAMPLE 4

According to the same procedure as in Example 1, photosensitive polyvinyl alcohol plates (Miraclon MF 94A manufactured by Tokyo Ohoka Kogyo Kabushiki Kaisha; size: A2) were treated. As a result, printing plates were continuously obtained every 3.5 minutes.

EXAMPLE 5

According to the same procedure as in Example 2, photosensitive polyamide plates (Torelief 95 BS manufactured by Toray Kabushiki Kaisha; size A0) were treated. As a result, printing plates were continuously obtained every 7 minutes.

What is claimed is:

1. A continuous plate making method for a photosensitive resin plate, which comprises the steps of: setting the photosensitive resin plate on an inside surface of an endless belt which moves in a substantially circular orbit so that the inside surface thereof is radially faced to the inside of the orbit; and continuously subjecting the photosensitive resin plate to, at least, washing out, drying and then post light exposure as the belt moves continuously.

2. A method according to claim 1, wherein the photosensitive resin plate is automatically removed from the surface of the endless belt by directing the belt toward the outside of its circular orbit so as to vary the curvature radius of the circular orbit after the photosensitive resin plate has been subjected to washing out, drying and post light exposure.

3. A method according to claim 1, wherein the photosensitive resin plate is automatically removed from the surface of the belt by directing the belt toward the inside of its circular orbit so as to vary the curvature radius of the circular orbit after the photosensitive resin plate has been subjected to washing out, drying and post light exposure.

4. A continuous plate making device for a photosensitive resin plate which comprises a carrier means arranged in a substantially circular shape, at least one endless belt which receives a photosensitive resin plate and moves along the carrier means on an orbit defined by the carrier means, wherin the inside surface of the belt radially faces the inside of the orbit thereof, and a means for subjecting the photosensitive plate to, at least, washing out, drying and post light exposure steps arranged around the orbit of the belt so that the treatment of each step is carried out in order as the belt moves continuously.

5. A device according to claim 4, wherein the belt is directed toward the outside of its circular orbit so as to vary the curvature radius of the circular orbit so that the photosensitive resin plate is automatically removed from the device after the photosensitive resin plate has been subjected to washing out, drying and post light exposure.

6. A device according to claim 4, wherein the belt is directed toward the inside of its circular orbit so as to vary the curvature radius of the circular orbit so that the photosensitive rein plate is automatically removed from the device after the photosensitive resin plate has been subjected to washing out, drying and post light exposure.

7. A continuous plate making device for a photosensitive resin plate which comprises a carrier means arranged in a substantially circular shape, at least one endless belt which receives a photosensitive resin plate and moves along the carrier means on an orbit defined by the carrier means, said belt having a sticky surface on which the photosensitive resin plate is received, and a means for subjecting the photosensitive plate to, at least, washing out, drying and post light exposure steps arranged around the orbit of the belt so that the treatment of each step is carried out in order as the belt moves continuously.

* * * * *